United States Patent
Kingsley et al.

(10) Patent No.: US 7,373,560 B1
(45) Date of Patent: May 13, 2008

(54) CIRCUIT FOR MEASURING SIGNAL DELAYS OF ASYNCHRONOUS INPUTS OF SYNCHRONOUS ELEMENTS

(75) Inventors: Christopher H. Kingsley, San Jose, CA (US); Kusuma Bathala, San Jose, CA (US); Richard D. J. Duce, San Jose, CA (US); Paul A. Swartz, Hillsborough, CA (US)

(73) Assignee: Xilinx, Inc., San Jose, CA (US)

( * ) Notice: Subject to any disclaimer, the term of this patent is extended or adjusted under 35 U.S.C. 154(b) by 580 days.

(21) Appl. No.: 11/008,474

(22) Filed: Dec. 8, 2004

(51) Int. Cl.
*G11B 5/00* (2006.01)

(52) U.S. Cl. ...................... 714/700; 714/707

(58) Field of Classification Search ............ 714/700, 714/707, 734, 744, 790; 331/57; 324/617, 324/633; 327/265, 141; 365/201
See application file for complete search history.

(56) References Cited

U.S. PATENT DOCUMENTS

| | | | |
|---|---|---|---|
| 3,603,746 A | 9/1971 | Heick et al. | |
| 4,489,272 A | 12/1984 | McLeod | |
| 4,517,532 A | 5/1985 | Neidorff | |
| 4,792,932 A | 12/1988 | Bowhers et al. | |
| 5,045,811 A | 9/1991 | Lewis | |
| 5,083,049 A * | 1/1992 | Kagey ................. | 327/141 |
| 5,923,676 A | 7/1999 | Sunter et al. | |
| 6,061,282 A * | 5/2000 | Tamaki ............... | 365/201 |
| 6,075,418 A | 6/2000 | Kingsley | |
| 6,144,262 A | 11/2000 | Kingsley | |
| 6,232,845 B1 * | 5/2001 | Kingsley et al. ......... | 331/57 |
| 6,426,641 B1 | 7/2002 | Koch et al. | |
| 6,515,549 B2 | 2/2003 | Nakano | |
| 6,888,414 B2 | 5/2005 | Albean | |

OTHER PUBLICATIONS

U.S. Appl. No. 10/447,132, filed May 27, 2003, Verma et al.

\* cited by examiner

*Primary Examiner*—Guy Lamarre
*Assistant Examiner*—Fritz Alphonse
(74) *Attorney, Agent, or Firm*—William L. Paradice, III

(57) ABSTRACT

A system measures propagation delays in any number of test circuits, each having two asynchronous inputs and an output, without using their clock inputs to re-initialize the test circuits during measurement operations. The delay between one of the test circuit's asynchronous inputs and its output is measured by propagating a test signal from the one asynchronous input to the output, and the test circuit is re-initialized using the test circuit's other asynchronous input.

21 Claims, 13 Drawing Sheets

CIRCUIT FOR MEASURING SIGNAL DELAYS OF ASYNCHRONOUS INPUTS OF SYNCHRONOUS ELEMENTS

FIELD OF INVENTION

This invention relates generally to measuring signal propagation delays, and in particular to measuring signal propagation delays through asynchronous inputs of synchronous circuit elements.

DESCRIPTION OF RELATED ART

Integrated circuit (IC) devices are typically tested before delivery to customers to ensure that the devices meet various performance parameters specified by the IC manufacturer. For example, most IC devices are tested to measure the propagation delays within and between various circuit elements of the device to ensure that the device operates at some minimum specified speed or within a specified range of speeds. Many early techniques for measuring device propagation delays employ a tester that provides a test signal to an input pin of the device and receives the test signal from an output pin of the device, wherein the time required for the test signal to propagate from the device's input pin to the device's output pin provides a timing parameter for the device. Unfortunately, such techniques are problematic because many signal paths within an IC device are not directly accessible via its input and output pins. Further, conventional testers typically have tolerances that may have a significant impact on propagation delay measurements, particularly when the path of interest is relatively short.

As a result, some more recent techniques for determining performance parameters of an IC device utilize circuitry within the device to measure propagation delays along various paths of interest in the IC device. For example, U.S. Pat. No. 6,144,262, which is incorporated herein by reference in its entirety, describes a technique in which a number of synchronous elements are configured in a loop to form an oscillator whose output signal is indicative of the delay through the synchronous elements. More specifically, when the oscillator described in U.S. Pat. No. 6,144,262 is implemented in a programmable device such as a programmable logic device (PLD) including a field programmable gate array (FPGA), a number of test circuits may be programmably inserted between the synchronous elements, and measure the propagation delays in the test circuits, the test circuits must be initialized to a predetermined state prior to each logic transition of the test signal. For synchronous test circuits, the technique described in U.S. Pat. No. 6,144,262 initializes the test circuits to a predetermined state between cycles of the test signal by propagating the test signal through the test circuits. However, for asynchronous test circuits, the technique described in U.S. Pat. No. 6,144,262 is not able to initialize the test circuits to a predetermined state by propagating the test signal through the test circuits, but rather requires additional circuitry to provide various initialization signals to the asynchronous inputs of the test circuits, which in turn requires very precise timing mechanisms to ensure that the test circuits are properly re-initialized to the predetermined states between cycles of the test signal. Unfortunately, in practice, providing such precisely timed initialization signals to the asynchronous inputs of the test circuits may be difficult to implement.

Accordingly, there is a need for a technique to measure the propagation delays through a number of asynchronous test circuits without requiring precisely timed initialization signals.

SUMMARY

A system is disclosed that provides an accurate measurement of propagation delays between an asynchronous input and an output of a test circuit without toggling a clock input of the test circuit to re-initialize the test circuit during measurement operations. An oscillator circuit is formed having any number of stages connected in a chain, with each stage including at least one asynchronous test circuit coupled between first and second control elements. For some embodiments, the asynchronous test circuit includes two asynchronous inputs, a clock input, and an output, wherein assertion of one asynchronous input drives the output of the test circuit to a first logic state and assertion of the other asynchronous input drives the output of the test circuit to a second logic state.

During operation, each test circuit output is initialized to a predetermined logic state, and a test clock signal is propagated through the oscillator stage(s). Then, the output of each test circuit is re-initialized to the predetermined logic state, and the test clock is again propagated through the oscillator stage(s). The period of the test signal may be used to determine the propagation delay between either of the two asynchronous inputs and the output of each test circuit.

In accordance with the present invention, the delay between a first asynchronous input and the output of each test circuit may be measured by propagating the test signal from the first asynchronous input to the output, and the output of the test circuit may be re-initialized to the predetermined logic state using a second asynchronous input of the test circuit. In this manner, the test circuit may be re-initialized without using its clock input, which as described below may simplify the circuitry and ease signal timing constraints associated with re-initializing the test circuits, as compared to prior techniques.

For some embodiments, the test circuit is a flip-flop having asynchronous set and clear inputs. For one embodiment, the clear input is dominant over the set input. For another embodiment, the set input is dominant over the clear input.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

Embodiments of the present invention are described below in the context of measuring various signal propagation delays of flip-flops having asynchronous set and clear terminals for simplicity only. It is to be understood that present embodiments are equally applicable for measuring signal propagation delays of other asynchronous circuits. In the following description, for purposes of explanation, specific nomenclature is set forth to provide a thorough understanding of the present invention. In other instances, well-known circuits and devices are shown in block diagram form to avoid obscuring the present invention unnecessarily. Further, the logic states of various signals described herein are exemplary and therefore may be reversed or otherwise modified as generally known in the art. Accordingly, the present invention is not to be construed as limited to specific examples described herein but rather includes within its scope all embodiments defined by the appended claims.

Figure 1:
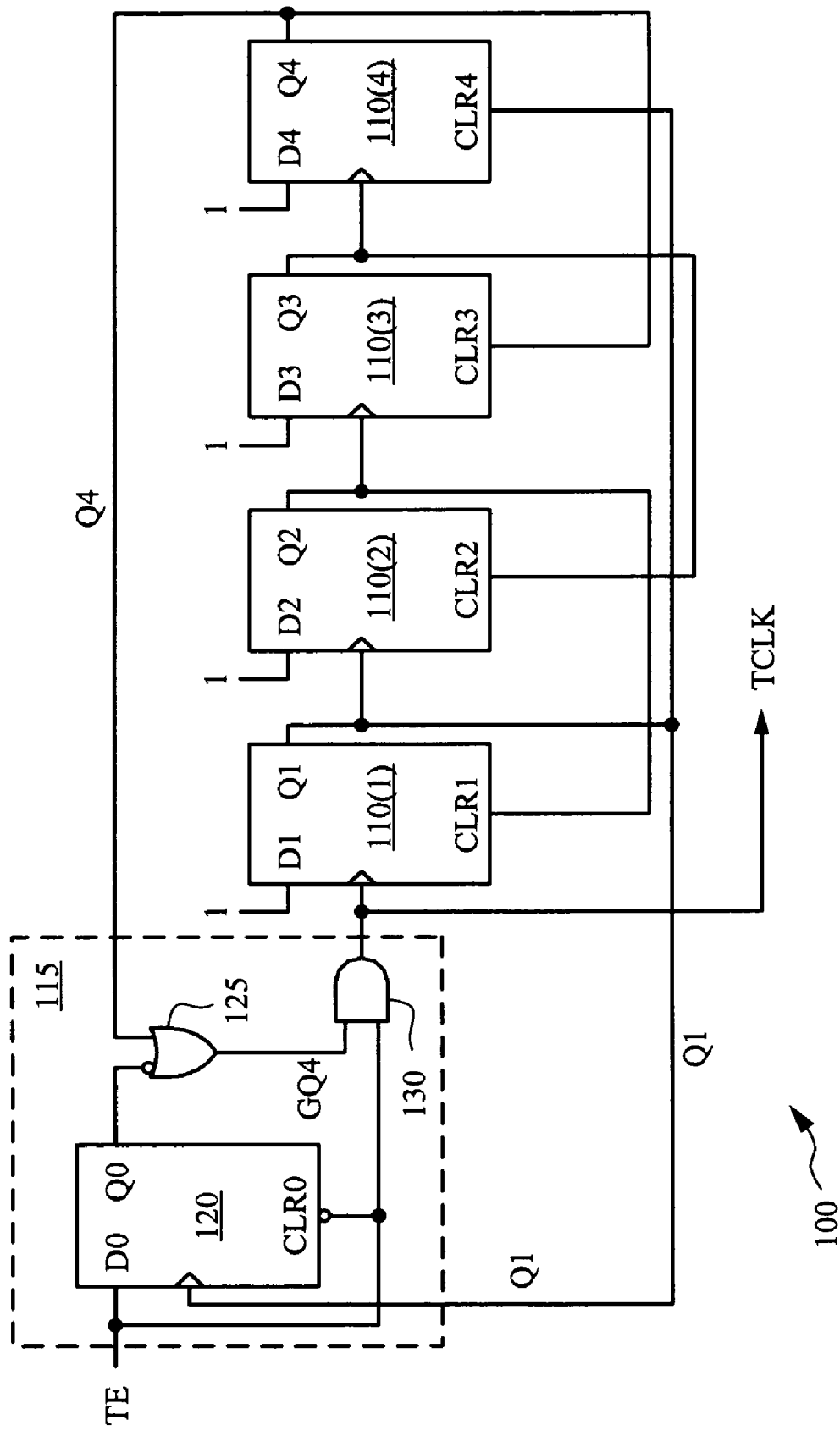
FIG. 1 is a schematic diagram of an oscillator configured to measure the clock-to-out delays of a number of synchronous elements using the rising edges of a clock signal.

FIG. 1 is a schematic diagram of an oscillator 100 that may be used to facilitate measurement of signal propagation delays of one or more test circuits in accordance with the present invention. Oscillator 100 produces an oscillating test signal TCLK having a period that includes the clock-to-out delays of four synchronous components, which are shown in FIG. 1 as control flip-flops 110(1)-110(4). Oscillator 100 includes an oscillator-enable circuit 115 connected to the clock input of flip-flop 110(1) via a test-clock line TCLK. Oscillator-enable circuit 115 includes a flip-flop 120, an OR gate 125, and an AND gate 130. As discussed below with respect to FIG. 2, oscillator-enable circuit 115 produces an edge on test-clock line TCLK when test-enable line TE is brought high. The rising edge on TCLK causes oscillator 100 to begin oscillating. Returning test-enable line TE to logic zero turns oscillator 100 off.

A test-enable signal TE is provided to a synchronous input terminal D0 of flip-flop 120, to an inverted asynchronous input terminal CLR0 of flip-flop 120, and to a first input terminal of AND gate 130. For other embodiments, the D0 input of flip-flop 120 may be connected to a logic one signal (e.g., to VDD). An output terminal Q0 of flip-flop 120 is connected to an inverted input of OR gate 125. The output terminal of OR gate 125 is connected to a second input terminal of AND gate 130 via signal line GQ4. Oscillator-enable circuit 115 also receives a pair of feedback signals Q1 and Q4 from respective flip-flops 110(1) and 110(4), where signal Q1 is provided to the clock input of flip-flop 120 and signal Q4 is provided to a non-inverted input terminal of OR gate 125.

The output terminal Q of each flip-flop 110(1)-110(4) is connected to the clock terminal (>) of a subsequent flip-flop, and to an asynchronous clear terminal (CLR) of a previous flip-flop. For example, output terminal Q2 of flip-flop 110(2) is connected to both the clock terminal of flip-flop 110(3) and to the asynchronous clear terminal CLR1 of flip-flop 110(1). Each rising edge on any given clock terminal thus propagates through to the subsequent flip-flop, and then the subsequent flip-flop clears the preceding flip-flop to prepare the preceding flip-flop for the next rising edge. Each subsequent flip-flop thus acts as a synchronous delay element between the output terminal and the clear terminal of a previous flip-flop. For other embodiments having more than four flip-flops connected in a chain, more than one subsequent flip-flop 110 may be used as the synchronous delay element between the output terminal and the clear terminal of a previous flip-flop 110. Output Q4 from flip-flop 110(4) is connected via circuit 115 to the clock input terminal of flip-flop 110(1) so that flip-flops 110(1)-110(4) form a ring oscillator that responds to rising clock edges only.

Figure 2:
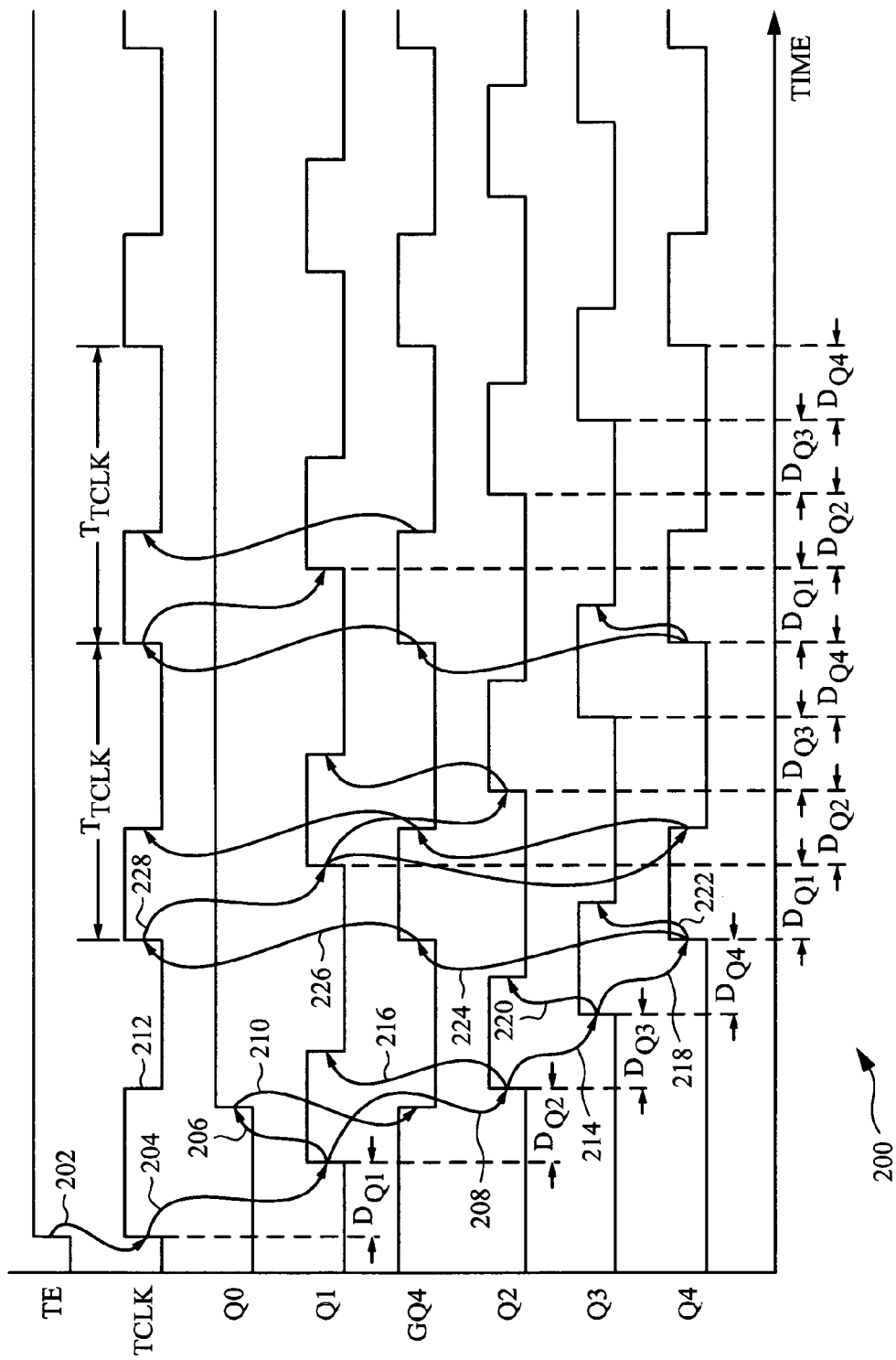
FIG. 2 is a waveform diagram illustrating an exemplary operation of the oscillator of FIG. 1.

FIG. 2 is a waveform diagram 200 illustrating an operation of oscillator 100 of FIG. 1. Each waveform in FIG. 2 is labeled using the corresponding node designation depicted in FIG. 1, and lines terminating with differently named input and output nodes are named for output nodes. For example, the line connecting output terminal Q2 of flip-flop 110(2) to the clock terminal of flip-flop 110(3) and the clear terminal of flip-flop 110(1) is labeled "Q2." The node designations are hereafter used to alternatively refer to circuit nodes or their corresponding signals. In each instance, the interpretation of the node designations as either signals or physical elements will be clear from the context.

Initially, all flip-flops 110(1)-110(4) are cleared to initialize their outputs to logic zero, for example, by briefly providing an asserted clear signal to the clear inputs of flip-flops 110(1)-110(4). For some embodiments, a global clear signal (not shown for simplicity) may be provided to the clear inputs of flip-flops 110(1)-110(4) to initialize Q1-Q4 to logic zero, for example, as described in U.S. Pat. No. 6,144,262. The logic low signal on Q0 causes OR gate 125 to drive its output on signal line GQ4 to logic one.

A test cycle begins when test-enable signal TE is asserted (e.g., to a logic one). Because line GQ4 carries a logic one, AND gate 130 passes the rising edge from test-enable signal TE to test-clock terminal TCLK (arrow 202), and consequently to the clock terminal of flip-flop 110(1). The rising edge on the clock terminal of flip-flip 110(1) clocks flip-flop 110(1) so that the logic one on input terminal DI transfers to output terminal Q1 after the clock-to-out delay $D_{Q1}$ associated with flip-flop 110(1) (arrow 204).

The rising edge of signal Q1 does three things. First, the rising edge of signal Q1 clocks flip-flop 110(2) so that the logic one on input D2 transfers to output terminal Q2 after the clock-to-out delay $D_{Q2}$ associated with flip-flop 110(2) (arrow 208). Second, the rising edge of signal Q1 clears flip-flop 110(4). Clearing flip-flop 110(4) has no impact in the first instance of a rising edge on terminal Q1. However, as described below, each subsequent rising edge on test-clock line TCLK occurs when output Q4 of flip-flop 110(4) transitions from logic low to logic high, and thus flip-flop 110(4) must be cleared (e.g., its output reset to logic zero) to prepare TCLK for subsequent rising edges. Third, the rising edge of signal Q1 clocks flip-flop 120 so that test enable signal TE is transferred to output terminal Q0 (arrow 206).

The rising edge on line Q0 produces a falling edge on line GQ4 (arrow 210), which in turn produces a falling edge 212 on line TCLK. Flip-flop 110(1), which is a positive-edge-triggered flip-flop, is unaffected by falling edge 212. Falling edge 212 is important, however, because it prepares flip-flop 110(1) to respond to a subsequent rising clock edge. Line Q0 then remains at logic one for the duration of the test period, or as long as test-enable signal TE is asserted.

The rising edge of signal Q2 clocks flip-flop 110(3) so that the logic one on input D3 transfers to output Q3 after the clock-to-out delay $D_{Q3}$ associated with flip-flop 110(3) (arrow 214). The rising edge of signal Q2 also clears flip-flop 110(1), thereby resetting its output Q1 to logic zero (arrow 216). The resulting rising edge of signal Q3 then clocks flip-flop 110(4) so that the logic one on input D4 transfers to output Q4 after the clock-to-out delay $D_{Q4}$ associated with flip-flop 110(4) (arrow 218). The rising edge of signal Q3 also clears flip-flop 110(2) (arrow 220). Finally, the rising edge on line Q4 clears flip-flop 110(3) (arrow 222) and propagates through OR gate 125 and AND gate 130 to clock flip-flop 110(1) once again (arrows 224 and 226). Oscillator 100 then continues to cycle a pulse through flip-flops 110(1)-110(4) until test-enable line TE returns to logic zero, which causes AND gate 130 to block the feedback from flip-flop 110(4) from clocking flip-flop 110(1).

Cycling a pulse through flip-flops 110(1)-110(4) produces an oscillating test signal on test-clock terminal TCLK. The period $T_{TCLK}$ of the test signal includes the sum of rising edge clock-to-out delays $D_{Q1}$, $D_{Q2}$, $D_{Q3}$, and $D_{Q4}$. For actual embodiments, a counter (not shown for simplicity) may be employed to count the number of periods of TCLK to determine the delay of flip-flops 110(1)-110(4), for example, as described in U.S. Pat. No. 6,144,262.

Figure 3:
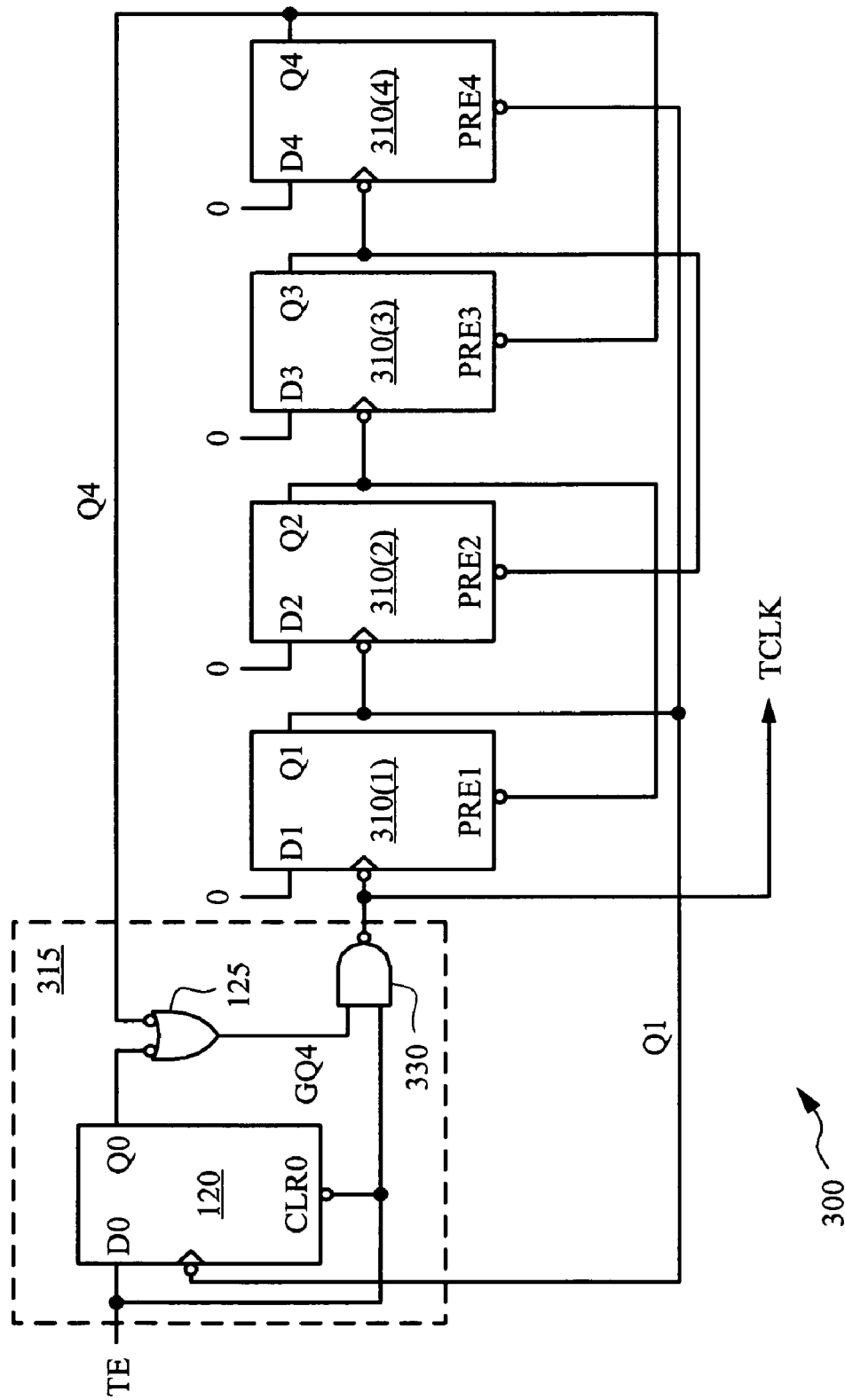
FIG. 3 is a schematic diagram of an oscillator configured to measure the clock-to-out delays of a number of synchronous elements using the falling edges of a clock signal.

FIG. 3 shows an oscillator 300 configured to respond to the falling edges of the clock signal to generate a test clock signal TCLK for which the period $T_{TCLK}$ includes the clock-to-out delays of flip-flops 310(1)-310(4). Flip-flops 310(1)-310(4) are falling-edge triggered, as indicated by the "bubbles" on their respective clock terminals. The operation of oscillator 300 is similar to that of oscillator 100 of FIG. 1, except that the test-clock period $T_{TCLK}$ of oscillator 300 includes the delay associated with falling edges propagating through flip-flops 310(1)-310(4), whereas the test-clock period $T_{TCLK}$ of oscillator 100 includes the delay associated with rising edges propagating through flip-flops 110(1)-110(4). Due to the similarities of oscillators 100 and 300, a detailed description of the operation of oscillator 300 is omitted for brevity.

Flip-flops 310(1)-310(4) are similar to flip-flops 110(1)-110(4). However, the respective "D" inputs of flip-flops 310(1)-310(4) are connected to logic zero, the clock terminals of flip-flops 310(1)-310(4) are negative-edge triggered, and instead of having feedback connections to their clear inputs as flip-flops 110(1)-110(4) of FIG. 1, each of flip-flops 310(1)-310(4) has a feedback line connected to a respective inverted preset terminal of a previous flip-flop. Oscillator 300 also includes an oscillator-enable circuit 315 that is similar to oscillator-enable circuit 115 of FIG. 1, except that the polarities of the clock input terminal of flip-flop 120 and the Q4 input to NOR gate 125 are reversed, and AND gate 130 is replaced by a NAND gate 330.

Oscillator 100 of FIG. 1 and oscillator 300 of FIG. 3 may be used to separately determine the delays associated with falling and rising edges propagating through flip-flops of the type used to implement flip-flops 110(1)-110(4) and 310(1)-310(4). The worst-case delay for such flip-flops may then be expressed as the longer of the two. Knowing the precise worst-case delay allows IC designers to minimize the guard band, and thus to more accurately guarantee speed performance. In addition, knowing which type of signal transition propagates more slowly through the oscillator allows IC designers to optimize signal paths more efficiently by focusing on those components responsible for the slower performance.

Figure 4A:
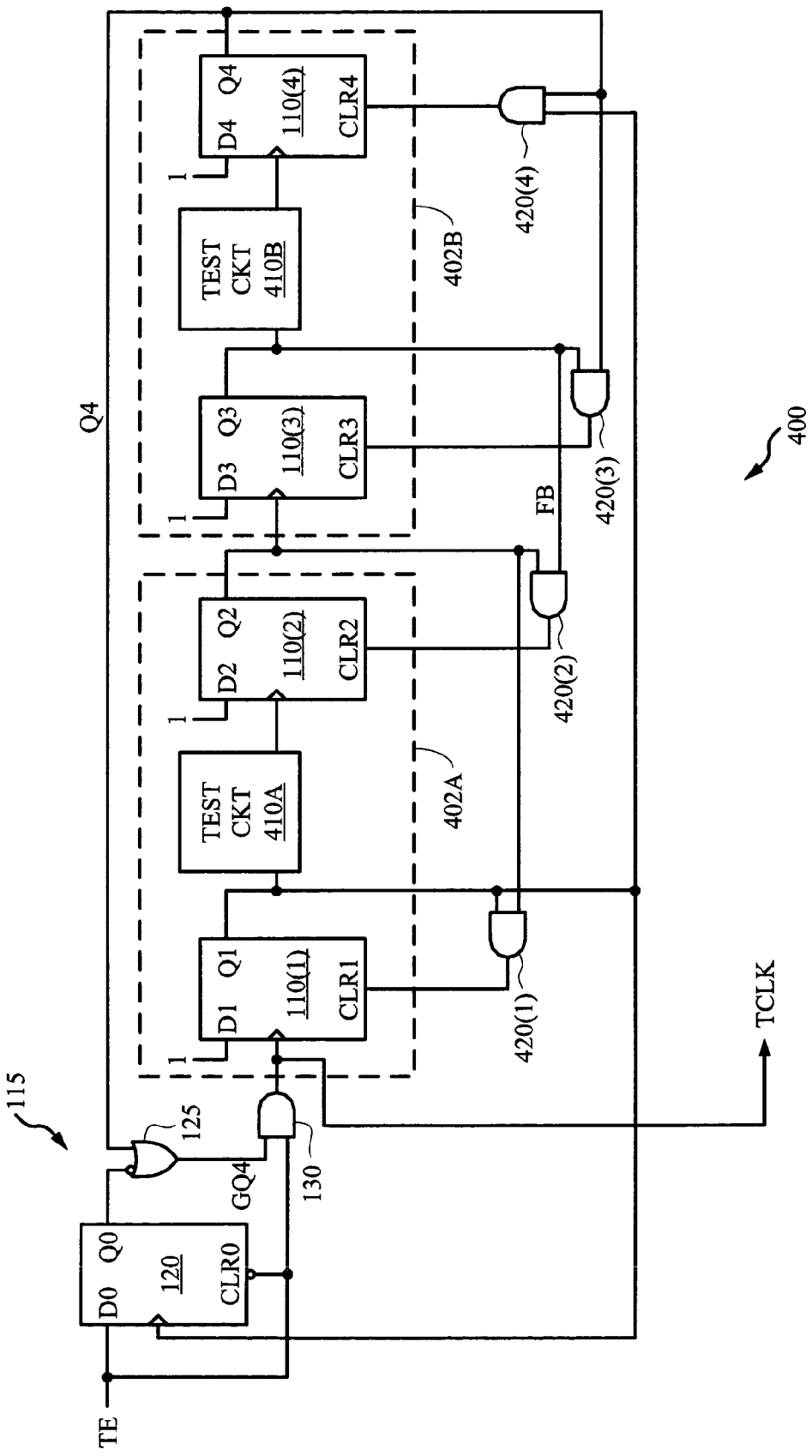
FIG. 4A is a schematic diagram of an oscillator configured to measure propagation delays in two test circuits.

Oscillator 100 (and/or oscillator 300) may be utilized to measure signal propagation delays of various signal lines and/or circuit elements. For example, FIG. 4A shows an oscillator 400 that is configured to measure signal propagation delays in a pair of similar test circuits 410A and 410B. Test circuits 410A and 410B are representative of various signal paths for which propagation delays are of interest. For purposes of discussion herein, control flip-flops 110(1)-110(2) and test circuit 410A form a first oscillator stage 402A, and control flip-flops 110(3)-110(4) and test circuit 410B form a second oscillator stage 402B. The output Q3 from control flip-flop 110(3) of downstream oscillator stage 402B provides a feedback signal FB to the upstream oscillator stage 402A.

For the exemplary embodiment of FIG. 4A, oscillator 400 is shown to include four AND gates 420(1)-420(4) that ensure that the clear signal for each flip-flop 110(1)-110(4) is de-asserted prior to the flip-flop receiving the next rising edge of the clock signal, as described in detail in U.S. Pat. No. 6,144,262. For other embodiments, AND gates 420(1)-420(4) may be eliminated. Further, although not shown in FIG. 4A for simplicity, other embodiments of oscillator 400 may also include a flip-flop connected to TCLK to minimize the loading on test-clock line TCLK, for example, as described in U.S. Pat. No. 6,144,262.

Oscillator 400 generates a test-clock TCLK having a period $T_{TCLK}$ that includes the rising-edge delay through flip-flops 110(1)-110(4) and the propagation delay through test circuits 410A-410B. The time required for each test circuit 410 to generate a rising edge at its output in response to a rising edge provided at its input indicates the signal propagation delay for the test circuit 410. Then, the test circuits 410A and 410B must be re-initialized (e.g., to reset their respective outputs set to logic zero) before the next rising edge of the test clock signal is received.

For some embodiments, test circuits 410A and 410B may be signal lines or combinational logic elements such as, for example, AND gates, NAND gates, OR gates, NOR gates, XOR gates, XNOR gates, multiplexers, and the like. For such embodiments, the outputs of test circuits 410A and 410B may be reset to logic zero in response to falling edges of the clock signal propagating through test circuits 410A and 410B, thereby re-initializing test circuits 410A and 410B prior to each rising edge of the clock signal.

Figure 4B:
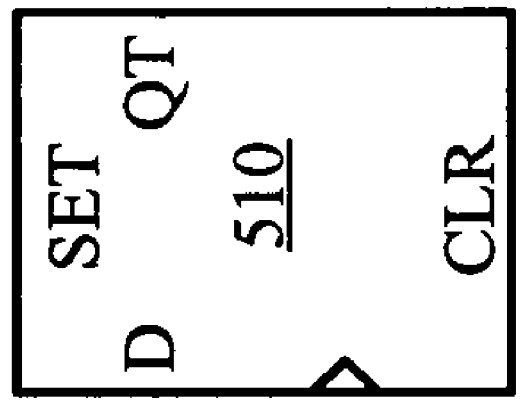
FIG. 4B is a block diagram of a test flip-flop having asynchronous input terminals that is one embodiment of the test circuits of FIG. 4A.

For other embodiments, test circuits 410A and 410B may be synchronous circuit elements having asynchronous set and/or clear inputs. For example, FIG. 4B shows a well-known synchronous flip-flop 510 having asynchronous set (SET) and clear (CLR) input terminals, a synchronous data input terminal (D), a clock terminal (>), and an output terminal (QT). For purposes of discussion herein, asserting the set terminal to logic high sets the flip-flop output QT to logic high, and asserting the clear terminal to logic high resets the flip-flop output QT to logic low. For embodiments in which test circuits 410 are implemented as flip-flops 510, propagating the falling edge of the clock signal through each flip-flop 510 will not properly re-initialize their outputs QT prior to each rising edge of the clock signal, and thus typically require additional circuitry to provide control signals to the asynchronous input terminals of flip-flops 510. However, the circuitry disclosed in U.S. Pat. No. 6,144,262 is not only complex, but also requires precise timing that may be difficult to implement in actual embodiments.

Thus, in accordance with the present invention, the control flip-flops 110 of oscillator 400 may be configured to re-initialize the outputs of test circuits 410A and 410B prior to the each rising edge of the clock signal without the need to generate precisely timed control signals for the asynchronous inputs of test circuits 410A and 410B. More specifically, various modifications of oscillator 400 are described below that may be used to measure the clear-to-out and the set-to-out delays of a number of test flip-flops 510. For purposes of discussion herein, flip-flop 510 is configured to have its clear signal dominant over its set signal so that if both the set and clear signals are simultaneously asserted, the output QT of flip-flop 510 is cleared to logic zero.

Figure 5:
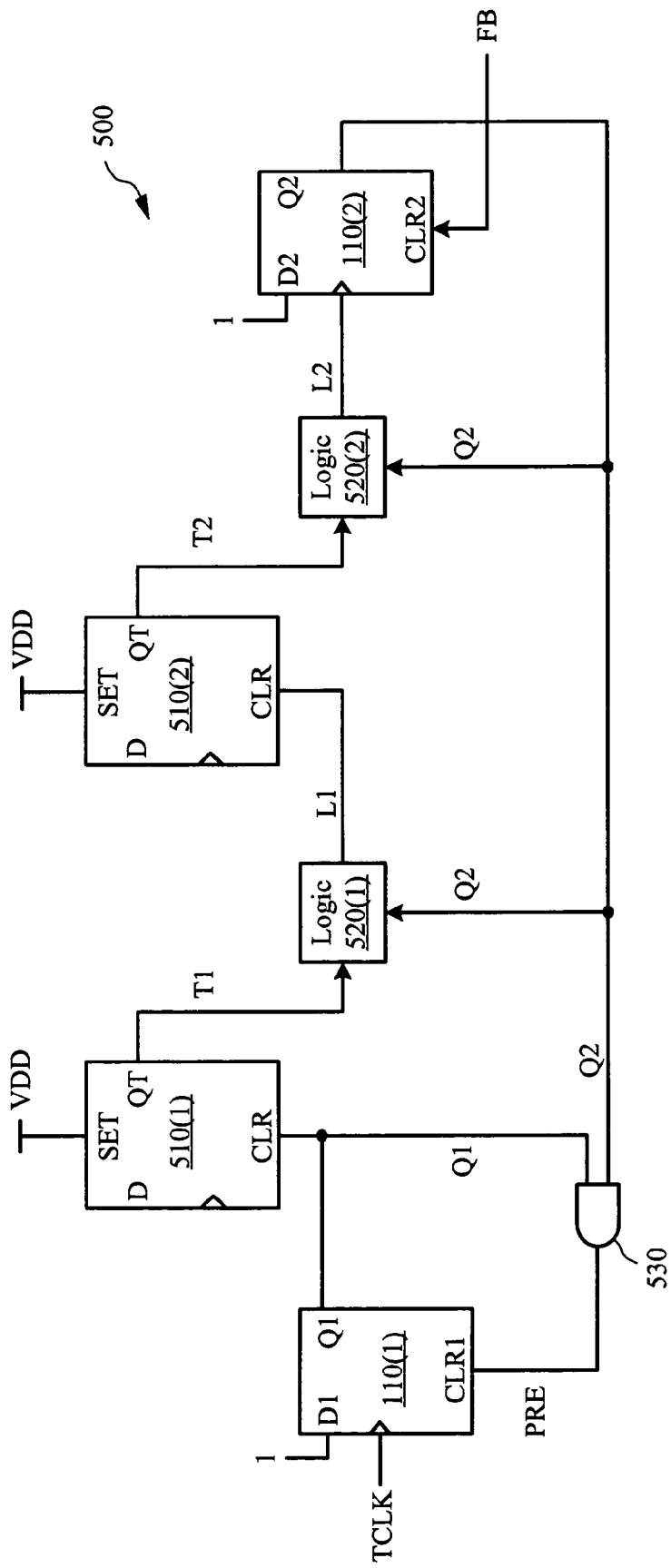
FIG. 5 is a schematic diagram of one embodiment of an oscillator stage of FIG. 4A configured to measure the clear-to-out delays of two asynchronous test elements using the rising edges of a clock signal.

FIG. 5 shows an oscillator stage 500 that is one embodiment of oscillator stage 402A of FIG. 4A. Oscillator stage 500, which is shown in FIG. 5 to include two synchronous test flip-flops 510(1) and 510(2) and two corresponding logic circuits 520(1)-520(2) connected between control flip-flops 110(1)-110(2), is configured to measure the clear-to-out delays of test flip-flops 510(1) and 510(2). Although shown in the exemplary embodiment of FIG. 5 as including two test elements 510(1) and 510(2), other embodiments of oscillator stage 500 may include other numbers of test elements 510. Note that as the number of test elements inserted between flip-flops 110(1) and 110(2) increases, the oscillator's clock period $T_{TCLK}$ becomes more sensitive to the delay through the test elements 510 and thus less sensitive to timing constraints of the control flip-flops 110(1)-110(2).

The set terminals of test flip-flops 510(1) and 510(2) are connected to the supply voltage (VDD), thereby maintaining the set signals in an asserted state so that each test flip-flop output QT is set to logic high unless the corresponding clear signal is asserted, in which case the flip-flop's output QT is reset (e.g., cleared) to logic zero. The data and clock terminals of test flip-flops 510(1) and 510(2) may be driven to any constant logic state (e.g., connected to either a logic high signal or a logic low signal), and thus for purposes of discussion herein are depicted in FIG. 5 as not connected to any particular logic signal. However, for actual embodiments, it is to be understood that the data and clock terminals of test flip-flops 510(1) and 510(2) are preferably driven to a predetermined logic state. The clear terminal of flip-flop 510(1) is connected to the output Q1 of control flip-flop 110(1) which is also connected to a first input of AND gate 530. The output of flip-flop 510(1) provides an output signal T1 to a first input of logic circuit 520(1), which includes a second input connected to the output Q2 of control flip-flop 110(2). Logic circuit 520(1) logically combines its input signals T1 and Q2 to generate an output signal L1 that is provided to the clear terminal of test flip-flop 510(2). The output of flip-flop 510(2) provides an output signal T2 to a first input of logic circuit 520(2), which includes a second input connected to the output Q2 of control flip-flop 110(2). Logic circuit 520(2) logically combines its input signals T2 and Q2 to generate an output signal L2 that is provided to the clock input of control flip-flop 110(2).

The synchronous input terminals D1 and D2 of corresponding control flip-flops 110(1) and 110(2) are coupled to a logic one signal (e.g., to VDD). The clock terminal of flip-flop 110(1) receives the test clock signal TCLK, for example, from control circuit 115 of FIG. 4A. The clear terminal of flip-flop 110(2) receives a feedback signal FB to clear flip-flop 110(2). For some embodiments, the feedback signal FB may be provided from an output of a downstream oscillator stage. For example, for embodiments having two serially-connected oscillator stages 500 (e.g., where each oscillator stage 402A and 402B of oscillator 400 is implemented as oscillator stage 500 of FIG. 5), the feedback signal FB may be provided from the output Q3 of control flip-flop 110(3) of a downstream stage 500. For other embodiments, the feedback signal FB may be provided from the output Q1 of control flip-flop 110(1). In some embodiments, the feedback signal may be logically combined with the output Q2 of control flip-flop 110(2) and applied to the clear terminal of control flip-flop 110(2).

For some embodiments, logic circuit 520(1) generates L1 according to the logic function $L1=\overline{T1}*\overline{Q2}$ so that L1 is asserted to logic one only if T1 and Q2 are both logic zero, and logic circuit 520(2) generates L2 according to the logic function $L2=\overline{T2}*\overline{Q2}$ so that L2 is asserted to logic one only if T2 and Q2 are both logic zero. The logic functions performed by logic circuits 520(1) and 520(2) are summarized below in Table 1. Thus, logic circuits 520(1) and 520(2) may be any well-known logic circuit that implements the logic function specified in Table 1, and therefore specific embodiments of logic circuits 520(1) and 520(2) are not described in detail herein for simplicity.

TABLE 1

| T1/T2 | Q2 | L1/L2 |
|---|---|---|
| 0 | 0 | 1 |
| 0 | 1 | 0 |
| 1 | 0 | 0 |
| 1 | 1 | 0 |

Figure 6:
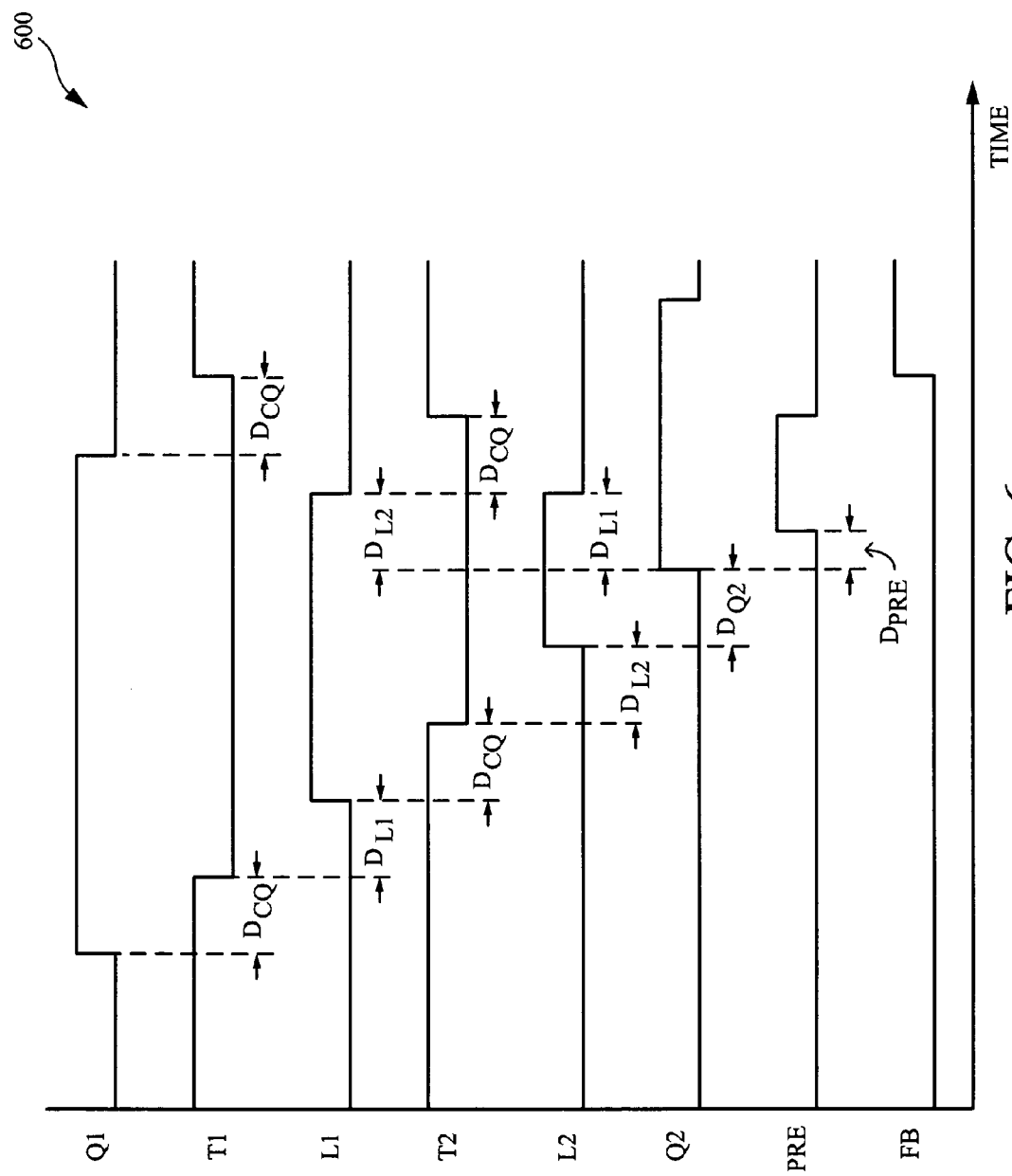
FIG. 6 is a waveform diagram illustrating an exemplary operation of the oscillator stage of FIG. 5.

An exemplary test operation for measuring the clear-to-out delays of test flip-flops 510(1) and 510(2) is described below with reference to the timing diagram of FIG. 6. For simplicity, the delays in FIG. 6 may be depicted as similar to each other. However, for actual embodiments, the delays between various signal transitions for oscillator 500 may be different from one another.

Initially, control flip-flops 110(1)-110(2) are cleared in a well-known manner to initialize their outputs Q1 and Q2 to logic low. For some embodiments, Q1 and Q2 may be initialized to logic low by pulsing the clear terminals of control flip-flops 110(1) and 110(2) to logic high, for example, in the manner described in U.S. Pat. No. 6,144,262. The resulting logic low state of Q1 provides a de-asserted clear signal to test flip-flop 510(1), thereby allowing its asserted set signal to initialize its output signal T1 to logic high. The logic high state of T1 forces logic circuit 520(1) to provide a logic low signal L1 to the clear terminal of flip-flop 510(2), thereby allowing the asserted set signal of flip-flop 510(2) to initialize its output signal T2 to logic high. The logic high state of T2 forces logic circuit 520(2) to provide a logic low signal L2 to the clock terminal of control flip-flop 110(2).

When TCLK transitions from logic low to logic high, its rising edge clocks flip-flop 110(1) so that the logic one on input terminal DI transfers to its output terminal Q1 after the clock-to-out delay $D_{Q1}$ associated with flip-flop 110(1), as described above with respect to FIGS. 1 and 2. Referring again to FIG. 6, the rising edge of Q1 is provided to the clear terminal of test flip-flop 510(1) and resets its output signal T1 to logic zero after the clear-to-out delay $D_{CQ}$ associated with test flip-flop 510(1). The falling edge of T1 causes logic circuit 520(1) to drive its output signal L1 to logic one after a delay $D_{L1}$ associated with logic circuit 520(1). The rising edge of L1 is provided to the clear terminal of test flip-flop 510(2) and resets its output signal T2 to logic zero after the clear-to-out delay $D_{CQ}$ associated with flip-flop 510(2). The falling edge of T2 causes logic circuit 520(2) to drive its output signal L2 to logic one after a delay $D_{L2}$ associated with logic circuit 520(2). The rising edge of L2 clocks control flip-flop 110(2) so that the logic one on input terminal D2 transfers to its output terminal Q2 after the clock-to-out delay $D_{Q2}$ associated with flip-flop 110(2).

The rising edge of Q2 causes logic circuit 520(1) to drive signal L1 to logic zero after a delay $D_{L1}$, and causes logic circuit 520(2) to drive signal L2 to logic zero after a delay $D_{L2}$. The falling edge of L1 de-asserts the clear signal for test flip-flop 510(2), which allows its asserted set signal to set its output signal T2 to logic one after the clear-to-out delay $D_{CQ}$. The falling edge of L2 has no effect on control flip-flop 110(2) other than preparing it to receive a subsequent rising edge on L2. The rising edge of Q2 also causes AND gate 530 to drive its output signal PRE to logic one after a gate delay $D_{PRE}$ associated with AND gate 530. The logic high state of PRE clears the output Q1 of flip-flop 110(1) to logic zero after the clear-to-out delay of flip-flop 110(1). The falling edge of Q1 de-asserts the clear signal for test flip-flop 510(1), which allows its asserted set signal to set its output signal T1 to logic high after the clear-to-out delay $D_{CQ}$. The falling edge of Q1 also causes AND gate 530 to drive its output to logic low, thereby de-asserting the clear signal PRE for control flip-flop 110(1) so that a subsequent rising edge of TCLK may initiate a new clock cycle for the oscillator. Thereafter, assertion of the feedback signal FB (e.g., from a subsequent oscillator stage) from logic low to logic high clears the Q2 output of control flip-flop 110(2) to logic low after the clear-to-out delay of flip-flop 110(2).

Thus, as described above, control flip-flops 110(1)-110(2) of oscillator stage 500 may be used to re-initialize the outputs QT of test flip-flops 510(1) and 510(2) for subsequent cycles of TCLK by exploiting the dominance of the clear signal over the set signal. In this manner, embodiments of the present invention may timely re-initialize test flip-flops 510(1) and 510(2) via their asynchronous input terminals employing circuitry that is much simpler and using control signals having less timing constraints than prior art techniques. More specifically, embodiments of the present invention are able to re-initialize test flip-flops 510 prior to each cycle of the test clock without toggling the clock signals to test flip-flops 510 which, as described in U.S. Pat. No. 6,144,262, not only requires more complex circuitry, but also requires more precise timing of the control signals. As a result, embodiments of the present invention are simpler to implement and may be more reliable than prior techniques disclosed in U.S. Pat. No. 6,144,262.

It should be noted that for the embodiment of FIG. 5 to function properly, the delay from a rising edge at output Q2 of control flip-flop 110(2) to the clear terminal of control flip-flop 110(1) to the resulting falling edge of Q1 to the resulting rising edge of T1 to logic circuit 520(1) must be shorter than the delay from a rising edge of Q2 to the rising edge of FB to the resulting falling edge of Q2 to logic circuit 520(1).

For other embodiments of FIG. 5, the set inputs to test flip-flops 510(1) and 510(2) may be connected to the Q2 output of control flip-flop 110(2) instead of to VDD.

Figure 7:
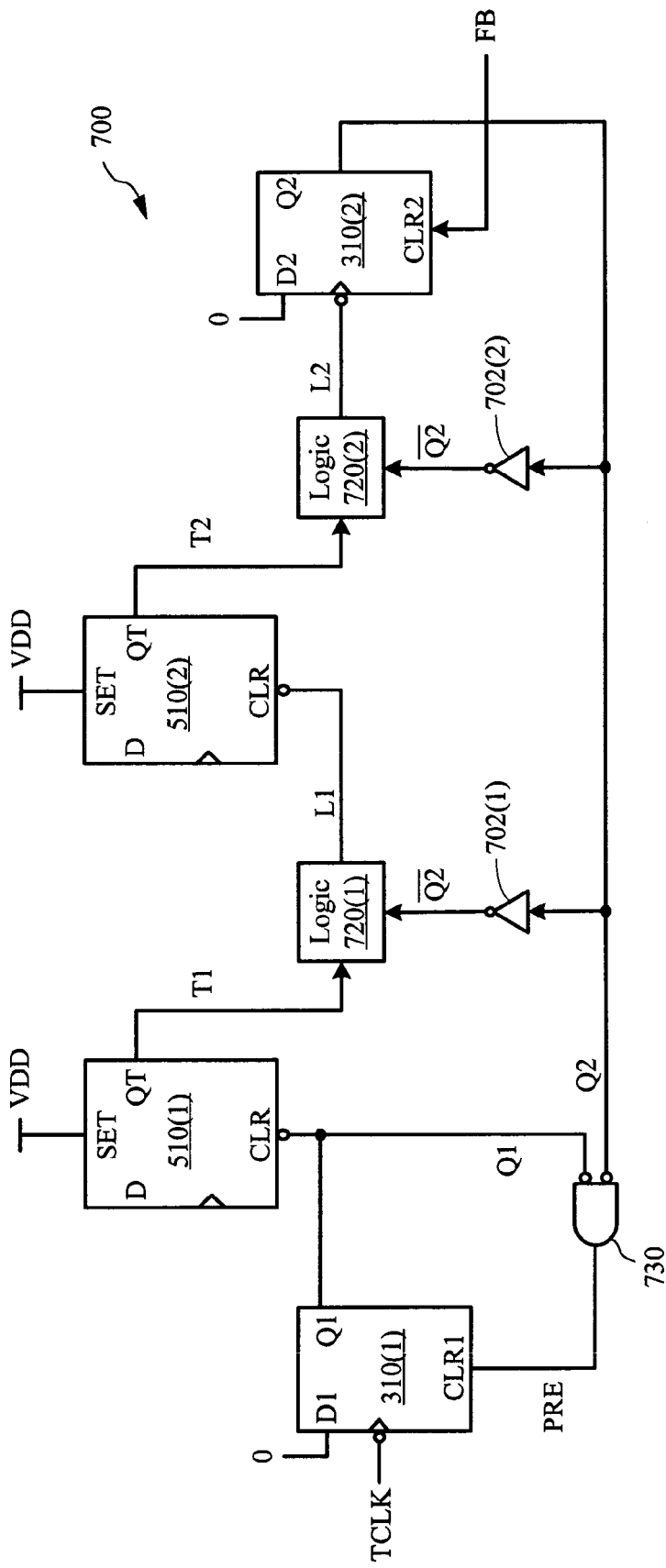
FIG. 7 is a schematic diagram of another embodiment of an oscillator stage of FIG. 4A configured to measure the clear-to-out delays of two asynchronous test elements using the falling edges of a clock signal.

FIG. 7 shows an oscillator stage 700 that is another embodiment of oscillator stage 402A of FIG. 4A. Oscillator 700 is similar to oscillator 500 of FIG. 5, except that positive edge-triggered control flip-flops 110(1) and 110(2) are replaced by negative edge-triggered control flip-flops 310(1) and 310(2), as indicated by the "bubbles" on their respective clock terminals, AND gate 530 is replaced by an AND gate 730 having inverted input terminals (e.g., a NOR gate), and the clear terminals of test flip-flops 510(1) and 510(2) are responsive to active low clear signals, as indicated by the "bubbles" on their respective clear terminals. Further, for embodiments of FIG. 7, inverters 702(1) and 702(2) provide the logical complement of Q2 (e.g., Q2) to corresponding inputs of logic circuits 720(1) and 720(2), respectively. Note that logic circuits 720(1)-720(2) provide an inverted version of the logic function provided by logic circuits 520(1)-520(2). In some embodiments, inverters 702(1)-702(2) may be absorbed into the logic of logic circuits 720(1)-720(2), respectively. Thus, oscillator 700 is configured to respond to the falling edges of the clock signal to generate a test clock signal TCLK for which the period $T_{TCLK}$ includes the clock-to-out delays of control flip-flops 310(1)-310(2) and the active low clear-to-out delays (i.e., the propagation delay from asserting the clear signal to a logic low output) of test flip-flops 510(1) and 510(2). For some embodiments of FIG. 7, TCLK may be provided by control circuit 315 of FIG. 3. Due to the similarities of oscillators 500 and 700, a detailed description of the operation of oscillator 700 is omitted for brevity.

Figure 8:
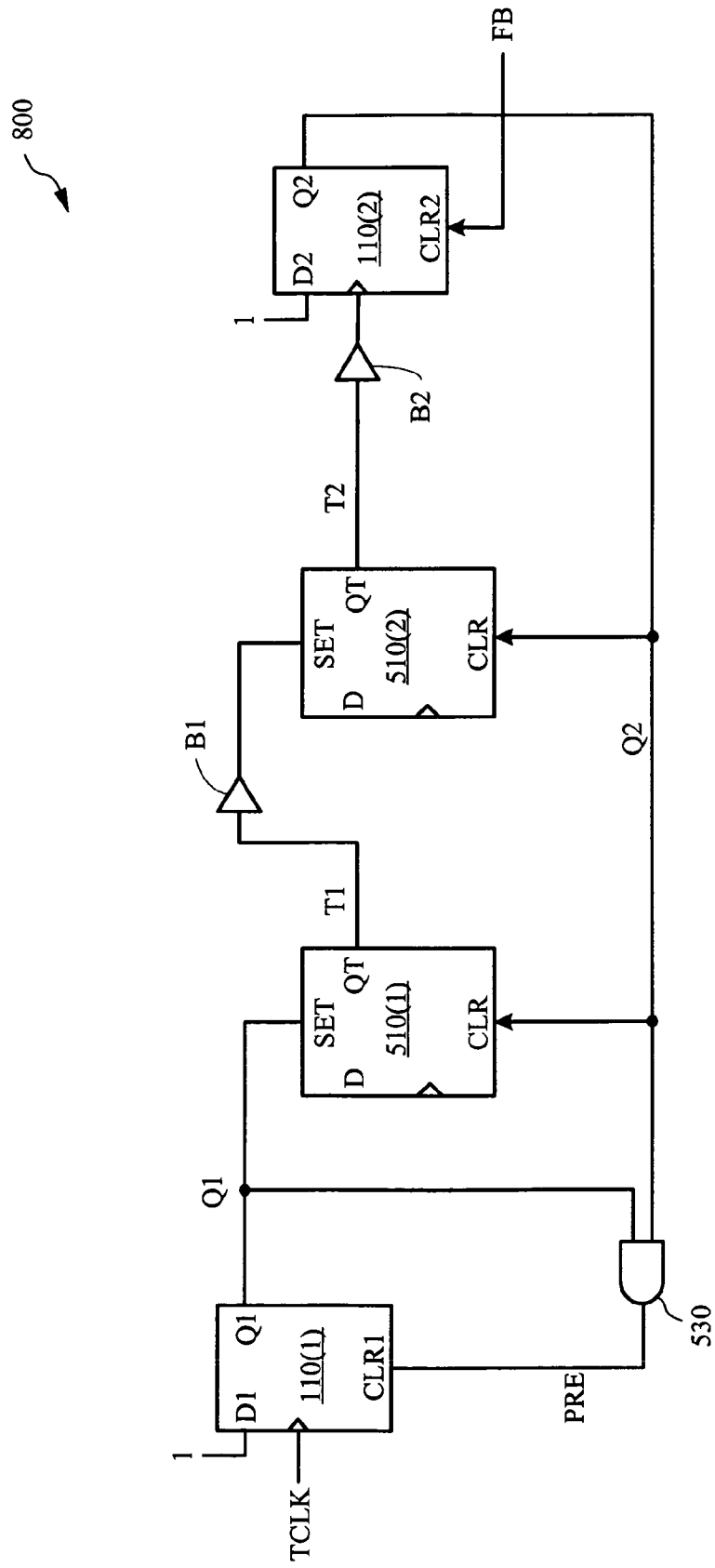
FIG. 8 is a schematic diagram of another embodiment of an oscillator stage of FIG. 4A configured to measure the set-to-out delays of two asynchronous test elements using the rising edges of a clock signal.

For other embodiments, oscillator 400 may be configured to measure the set-to-out delays for test flip-flops 510(1) and 510(2). For example, FIG. 8 shows an oscillator stage 800 that is another embodiment of oscillator stage 500 of FIG. 5. Oscillator stage 800 includes test flip-flops 510(1) and 510(2) and two corresponding buffer circuits B1 and B2 connected between control flip-flops 110(1) and 110(2). Although shown in the exemplary embodiment of FIG. 8 as including two test flip-flops 510(1) and 510(2), other embodiments of oscillator stage 800 may include other numbers of test elements.

The data and clock terminals of test flip-flops 510(1) and 510(2) may be driven to any constant logic state (e.g., connected to either a logic high signal or a logic low signal), and thus for purposes of discussion herein are depicted in FIG. 8 as not connected to any particular logic signal. However, for actual embodiments, it is to be understood that the data and clock terminals of test flip-flops 510(1) and 510(2) should be driven to a predetermined logic state. The set terminal of test flip-flop 510(1) is connected to the output Q1 of control flip-flop 110(1), and its output terminal QT is connected to the set terminal of test flip-flop 510(2) via buffer circuit B1, which may be any suitable signal buffering circuit. The output terminal QT of test flip-flop 510(2) is connected to the clock terminal of control flip-flop 110(2) via buffer circuit B2, which may be any suitable signal buffering circuit. The output terminal Q2 of control flip-flop 110(2) is connected to the clear terminals of test flip-flops 510(1) and 510(2) and to a first input terminal of AND gate 530, which includes a second input terminal connected to the output Q1 of flip-flop 110(1) and an output terminal to provide a control signal PRE to the clear terminal of control flip-flop 110(1).

The synchronous input terminals D1 and D2 of respective control flip-flops 110(1) and 110(2) are coupled to a logic one signal. The clock terminal of control flip-flop 110(1) receives the test clock signal TCLK, for example, from control circuit 115 of FIG. 4A. The clear terminal of control flip-flop 110(2) receives the feedback signal FB to clear flip-flop 110(2). For some embodiments in which two oscillator stages 800 are connected in series, the feedback signal FB may be provided from the output Q3 of control flip-flop 110(3) of the downstream oscillator stage 800. For other embodiments in which the oscillator includes only one oscillator stage 800, the feedback signal FB may be provided from the output Q1 of control flip-flop 110(1).

Figure 9:
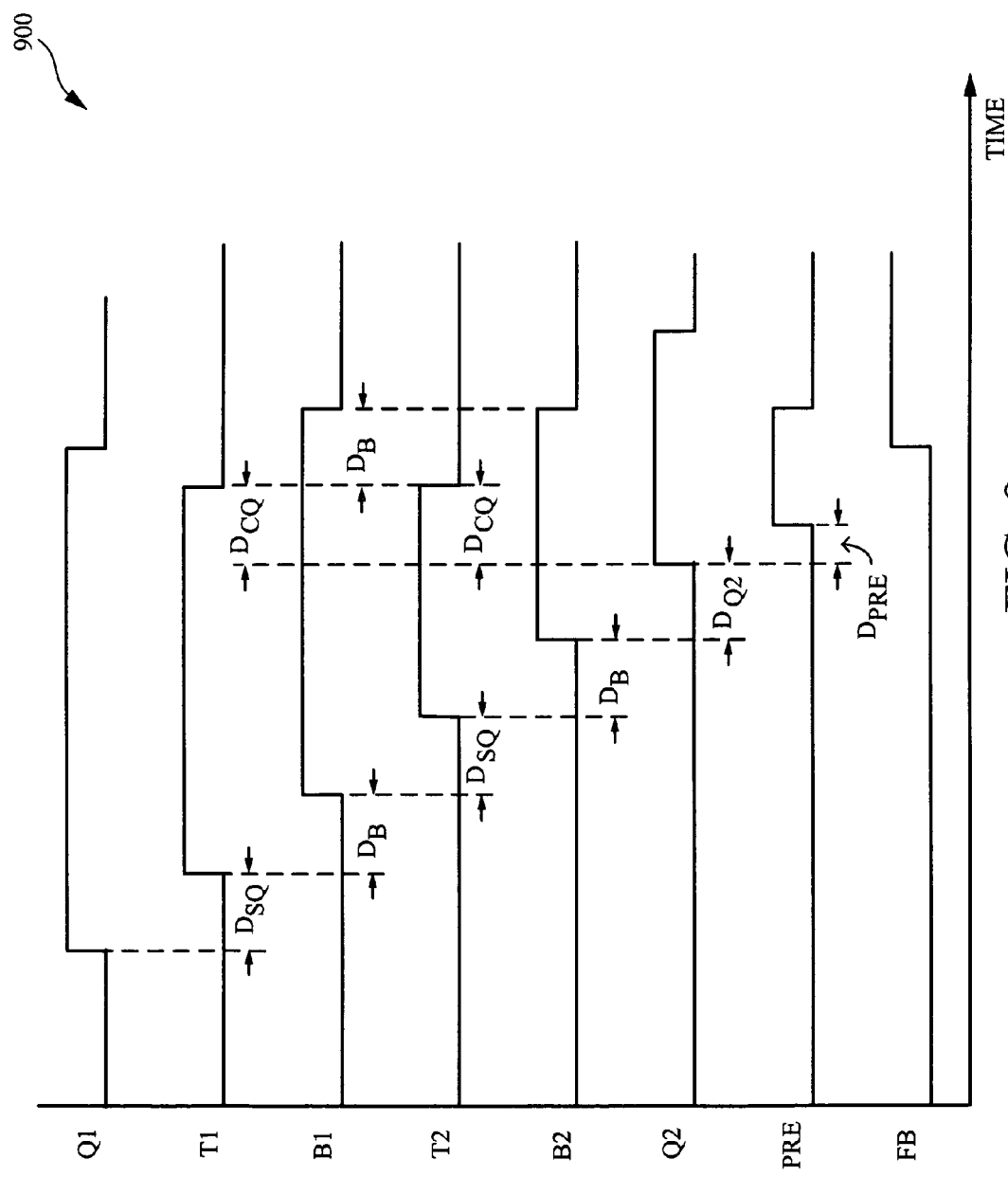
FIG. 9 is a waveform diagram illustrating an exemplary operation of the oscillator stage of FIG. 8.

An exemplary test operation for measuring the set-to-out delay of test flip-flops 510(1) and 510(2) of oscillator stage 800 is described below with reference to the timing diagram of FIG. 9. For simplicity, the delays in FIG. 9 may be depicted as similar to each other. However, for actual embodiments, the delays between various signal transitions for oscillator 800 may be different from one another.

Initially, control flip-flops 110(1)-110(2) are cleared to initialize their outputs Q1 and Q2 to logic zero in a well-known manner, for example, as described above with respect to FIG. 5. Test flip-flops 510(1)-510(2) may also be cleared. The initial logic low state of Q2 provides de-asserted clear signals to test flip-flops 510(1) and 510(2) and provides a de-asserted clear signal to control flip-flop 110(1) via AND gate 530. The initial logic low state of Q1 provides a de-asserted set signal to test flip-flop 510(1).

When TCLK transitions from logic low to logic high, its rising edge clocks control flip-flop 110(1) so that the logic one on its input terminal DI transfers to its output terminal Q1 after the clock-to-out delay associated with flip-flop 110(1), as described above with respect to FIGS. 1 and 2. Referring again to FIG. 9, the rising edge of Q1 is provided to the set terminal of test flip-flop 510(1) and sets its output signal T1 to logic one after the set-to-out delay $D_{SQ}$ associated with flip-flop 510(1). The rising edge of T1 causes buffer circuit B1 to drive its output signal to logic one after a delay $D_B$ associated with buffer circuit B1. The rising edge of B1 is provided to the set terminal of test flip-flop 510(2) and sets its output signal T2 to logic one after the set-to-out delay $D_{SQ}$ associated with flip-flop 510(2). The rising edge of T2 causes buffer circuit B2 to drive its output signal to logic one after the delay $D_B$ associated with buffer circuit B2. The rising edge of B2 clocks control flip-flop 110(2) so that the logic one on its input terminal D2 transfers to its output terminal Q2 after the clock-to-out delay $D_{Q2}$ associated with control flip-flop 110(2).

The rising edge of Q2 is provided to the clear terminals of test flip-flops 510(1) and 510(2), and after a clear-to-out delay $D_{CQ}$ associated with test flip-flops 510(1) and 510(2) resets their respective output signals T1 and T2 to logic zero (as discussed above, for flip-flops 510 used in these exemplary embodiments, the clear input is dominant over the set input). The logic low state of T1 de-asserts the set signal B1 for test flip-flop 510(2) via buffer B1, and the logic low state of T2 de-asserts the clock signal for control flip-flop 110(2) via buffer B2. The rising edge of Q2 also causes AND gate 530 to drive its output signal PRE to logic high after an associated gate delay $D_{PRE}$. The logic high state of PRE clears Q1 to logic zero after the clear-to-out delay of control flip-flop 110(1). The resulting logic low state of Q1 provides a de-asserted set signal to test flip-flop 510(1), and drives PRE to logic low via AND gate 530 so that a subsequent rising edge of TCLK may initiate a new clock cycle for the oscillator. Thereafter, assertion of the feedback signal FB (e.g., from a subsequent oscillator stage) from logic low to logic high clears the Q2 output of control flip-flop 110(2) to logic low after the clear-to-out delay of flip-flop 110(2).

It should be noted that for the embodiment of FIG. 8 to function properly, the delay from a rising edge at output Q2 of control flip-flop 110(2) to the clear terminal of control flip-flop 110(1) to the resulting falling edge of Q1 plus the signal delay from the output Q1 of control flip-flop 110(1) to the set terminal of test flip-flop 510(1) must be shorter than the delay from a rising edge of Q2 to the rising edge of FB to the resulting falling edge of Q2 plus the signal delay from the output Q2 of control flip-flop 110(2) to the clear terminal of test flip-flop 510(1).

For the exemplary embodiment of FIG. 8, buffer circuits B1 and B2 provide symmetry in the output paths of test flip-flops 510(1) and 510(2), respectively, between oscillator 800 of FIG. 8 and oscillator 1000 described below with respect to FIG. 10. For some embodiments, the gate delay of buffers B1 and B2 of FIG. 8 are similar to the gate delays of corresponding inverters 1002(1) and 1002(2) of FIG. 10. For other embodiments, buffer circuits B1 and B2 may be eliminated.

Figure 10:
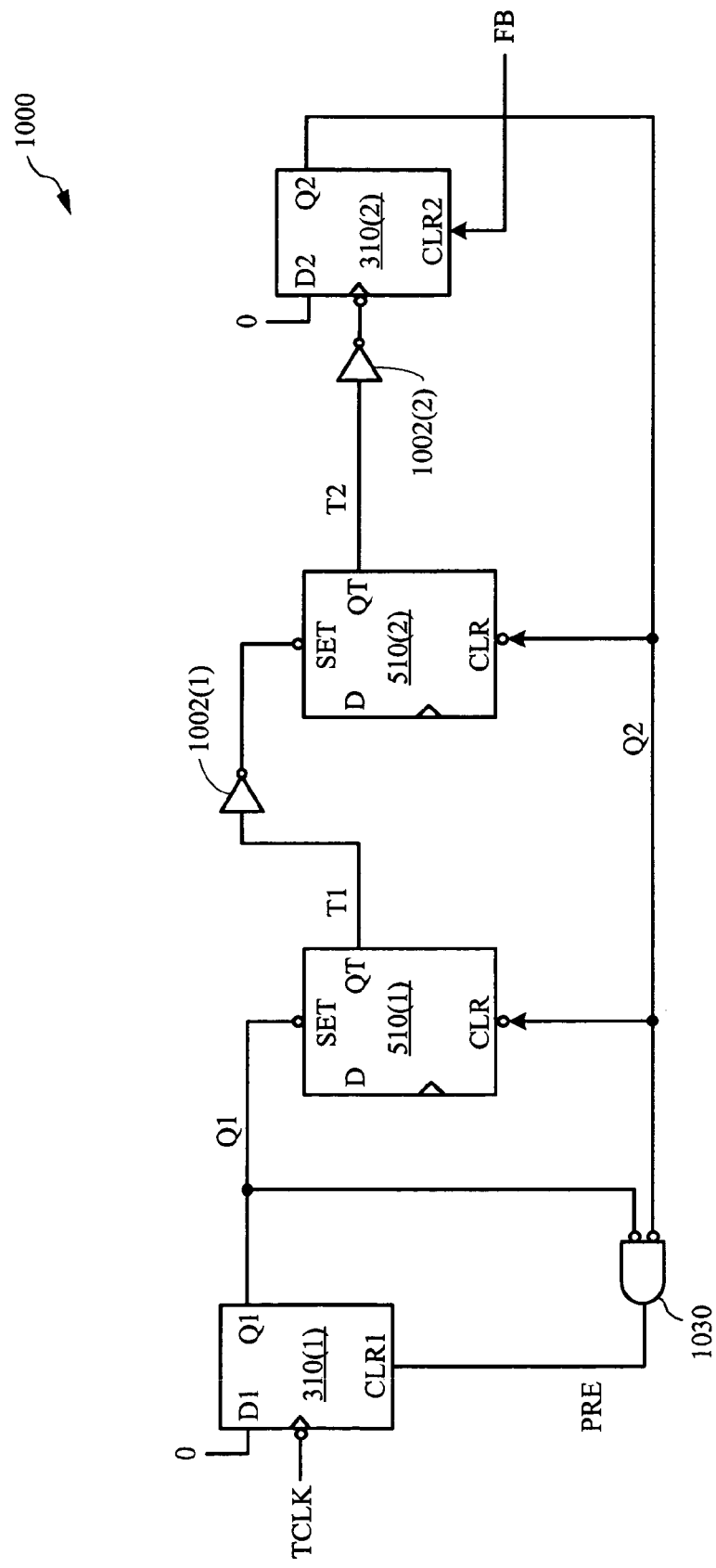
FIG. 10 is a schematic diagram of another embodiment of an oscillator stage of FIG. 4A configured to measure the set-to-out delays of two asynchronous test elements using the falling edges of a clock signal.

FIG. 10 shows an oscillator stage 1000 that is another embodiment of oscillator stage 402A of FIG. 4A. Oscillator 1000 is similar to oscillator 800 of FIG. 8, except that positive edge-triggered control flip-flops 110(1) and 110(2) are replaced by negative edge-triggered control flip-flops 310(1) and 310(2), as indicated by the "bubbles" on their respective clock terminals, AND gate 530 is replaced by NOR gate 1030, the clear and set terminals of test flip-flops 510(1) and 510(2) are responsive to active low control signals, as indicated by the "bubbles" on their respective clear and set terminals, and non-inverting buffers B1 and B2 are replaced by inverting buffers 1002(1) and 1002(2), respectively. Thus, oscillator 1000 is configured to respond to the falling edges of the clock signal to generate a test clock signal TCLK for which the period $T_{TCLK}$ includes the clock-to-out delays of control flip-flops 310(1)-310(2) and the active low set-to-out delays of test flip-flops 510(1) and 510(2). For some embodiments of FIG. 10, TCLK may be provided by control circuit 315 of FIG. 3. Due to the similarities of oscillators 800 and 1000, a detailed description of the operation of oscillator 1000 is omitted for brevity.

Embodiments of the present invention may be implemented in various types of semiconductor devices. Some embodiments of the present invention may be used to measure the clear-to-out and/or the set-to-out delays of flip-flops having asynchronous input terminals in a PLD. A PLD is a general-purpose device that can be programmed by a user to implement a variety of selected functions. One type of PLD is the Field Programmable Gate Array (FPGA), which typically includes an array of configurable logic blocks (CLBs) surrounded by a plurality of input/output blocks (IOBs). The CLBs are individually programmable and can be configured to perform a variety of logic functions on a few input signals. The IOBs can be configured to drive output signals from the CLBs to external pins of the FPGA and/or to receive input signals from the external FPGA pins. The FPGA also includes a programmable interconnect structure that can be programmed to selectively route signals among the various CLBs and IOBs to produce more complex functions of many input signals. The CLBs, IOBs, and the programmable interconnect structure are programmed by loading configuration data into associated memory cells that control various switches and multiplexers within the CLBs, IOBs, and the interconnect structure to implement logic and routing functions specified by the configuration data. Other PLD and FPGA arrangements are also possible and well-known in the art.

For embodiments implemented in FPGA devices, any number of flip-flops for which it is desired to measure the clear-to-out and/or the set-to-out delays may be programmably inserted as test flip-flops 510 into various oscillators of the present invention (e.g., using a test configuration for the FPGA), and thereafter the flip-flops may be programmably removed from the oscillator circuits (e.g., using an operational configuration for the FPGA) and used as functional elements in various resources of the FPGA. For one such embodiment, the flip-flops implemented as test elements 510 may be output flip-flops provided in one or more CLB slices of the FPGA. For another such embodiment, the flip-flops implemented as test elements 510 may be flip-flops provided in one or more IOBs of the FPGA.

Figure 11:
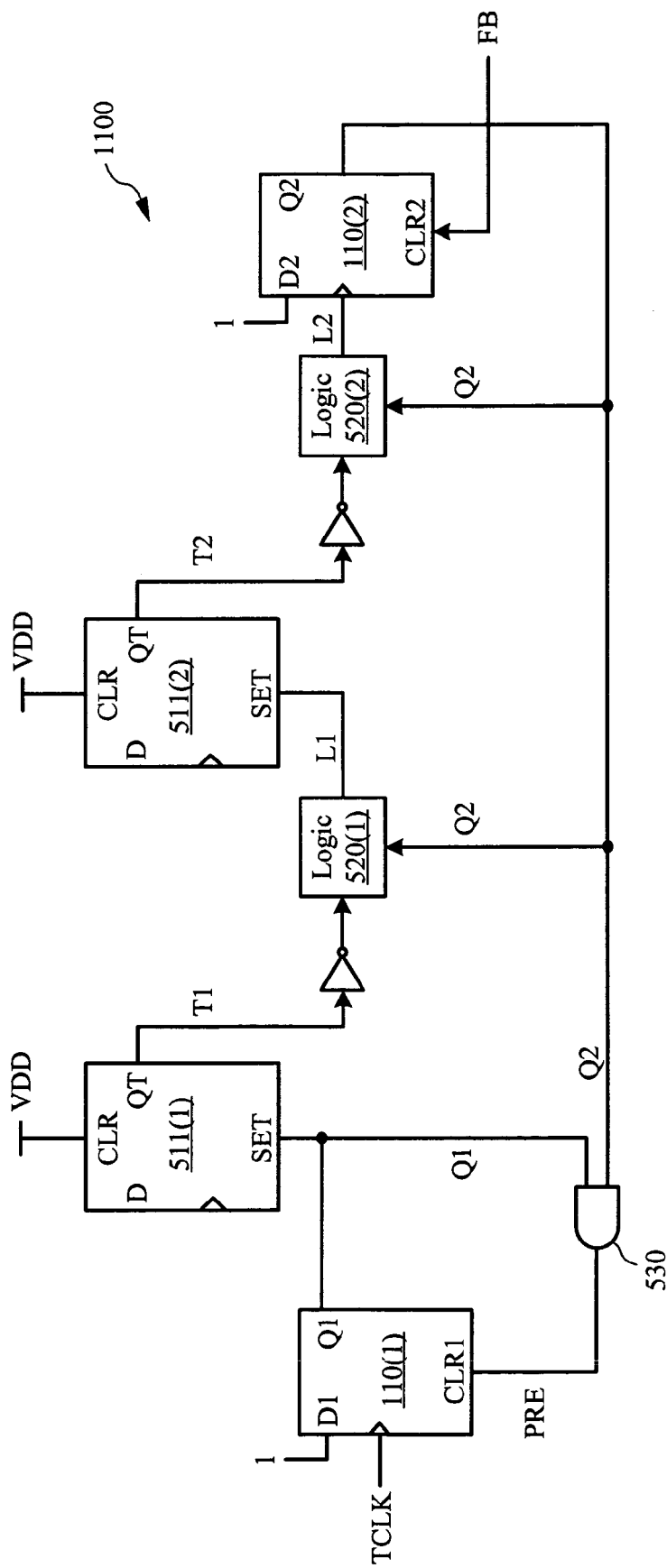
FIG. 11 is a schematic diagram of another embodiment of the oscillator stage of FIG. 5.

For the exemplary embodiments described above, the clear input of test flip-flop 510 is dominant over the set input. However, embodiments of the present invention are equally applicable for measuring the clear-to-out and the set-to-out delays of flip-flops for which the asynchronous set input is dominant over the asynchronous clear input. For one example, FIG. 11 shows an oscillator stage 1100 that is another embodiment of oscillator stage 402A of FIG. 4A. Oscillator 1100, which operates in a manner similar to oscillator 500 of FIG. 5, may be used to measure the set-to-out delays of test flip-flops 511(1) and 511(2). Test flip-flops 511 are similar to test flip-flops 510, except that for test flip-flops 511, the set terminal is dominant over the clear terminal. Due to the similarities of oscillators 1100 and 500, a detailed description of the operation of oscillator 1100 is omitted for brevity.

Figure 12:
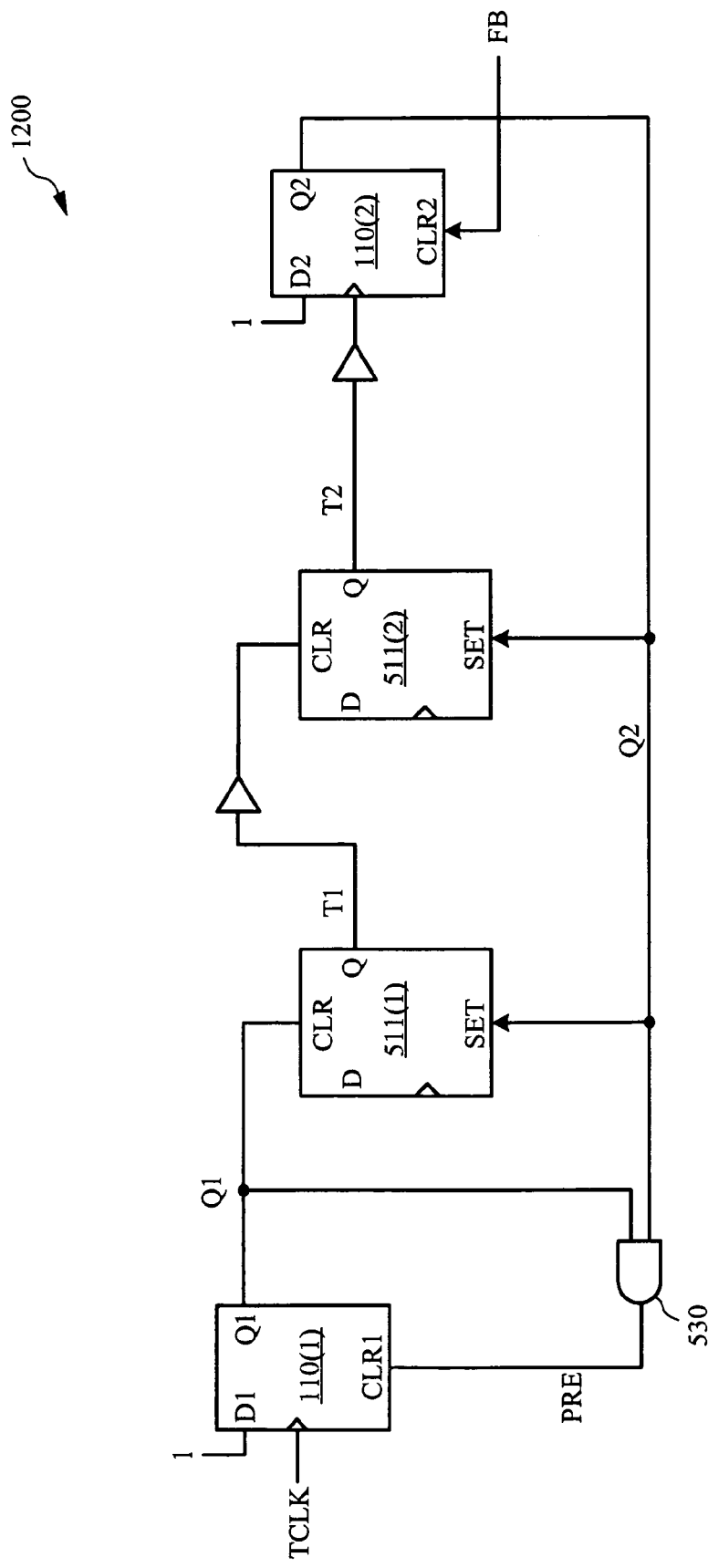
FIG. 12 is a schematic diagram of another embodiment of the oscillator stage of FIG. 8.

For another example, FIG. 12 shows an oscillator stage 1200 that is another embodiment of oscillator stage 402A of FIG. 4A. Oscillator 1200, which operates in a manner similar to oscillator 800 of FIG. 8, may be used to measure the clear-to-out delays of test flip-flops 511(1) and 511(2). Due to the similarities of oscillators 1200 and 800, a detailed description of the operation of oscillator 1200 is omitted for brevity.

While particular embodiments of the present invention have been shown and described, it will be obvious to those skilled in the art that changes and modifications may be made without departing from this invention in its broader aspects, and therefore, the appended claims are to encompass within their scope all such changes and modifications as fall within the true spirit and scope of this invention.

What is claimed is:

1. A system for measuring propagation delays in any number of synchronous test circuits, the system comprising a first stage including:
   an upstream memory element having an asynchronous input terminal, having a clock terminal to receive a test clock, and having an output terminal;
   a synchronous test circuit having a clock terminal, a synchronous data input terminal, an output terminal, a first asynchronous input terminal coupled to the output terminal of the upstream memory element, and a second asynchronous input terminal, wherein the first and second asynchronous input terminals are configurable to initialize the synchronous test circuit's output terminal to first and second logic states, respectively; and
   a downstream memory element having an asynchronous input terminal to receive a feedback signal, a clock terminal coupled to the output terminal of the synchronous test circuit, and an output terminal coupled to the asynchronous input terminal of the upstream memory element;
   wherein the first asynchronous input terminal of the synchronous test circuit comprises one of a clear terminal and a set terminal;
   wherein the second asynchronous input terminal of the synchronous test circuit is maintained in an asserted state.

2. The system of claim 1, wherein the first stage is configured to initialize the output terminal of the synchronous test circuit to a predetermined logic state by providing an asserted signal to at least one of the first and second asynchronous input terminals.

3. The system of claim 1, wherein each of the upstream and downstream memory elements comprises a flip-flop.

4. The system of claim 1, wherein the feedback signal is provided from a second stage connected in series with the first stage.

5. The system of claim 1, wherein the first stage further comprises:
   a logic circuit having a first input terminal coupled to the output terminal of the downstream memory element, a second input terminal coupled to the output terminal of the synchronous test circuit, and an output terminal coupled to the clock terminal of the downstream memory element.

6. The system of claim 5, wherein the logic circuit provides a clock edge to the clock terminal of the downstream memory element if the output signals from the synchronous test circuit and the downstream memory elements change such that both signals are de-asserted.

7. The system of claim 1, wherein the synchronous test circuit comprises a flip-flop.

8. The system of claim 1, wherein the second asynchronous input terminal of the synchronous test circuit is coupled to the output of the downstream memory element.

9. The system of claim 8, wherein the first asynchronous input terminal of the synchronous test circuit comprises one of a set terminal and a clear terminal.

10. The system of claim 9, wherein the synchronous test circuit comprises a flip-flop.

11. The system of claim 1, wherein the system is implemented in a programmable logic device, and the synchronous test circuit is capable of being programmably inserted into and removed from the system.

12. The system of claim 1, wherein the synchronous test circuit is a first synchronous test circuit, further comprising:
   a second synchronous test circuit having a clock terminal, a synchronous data input terminal, an output terminal, a first asynchronous input terminal coupled to the output terminal of the first synchronous test circuit, and a second asynchronous input terminal.

13. A system for measuring propagation delays in any number of test circuits, the system including any number of stages arranged as a ring oscillator, each stage comprising:
   a first control element having an asynchronous input, a clock input to receive a test clock, and an output;
   a second control element having an asynchronous input, a clock input, and an output coupled to the asynchronous input of the first control element;
   a first test circuit having a clock input, an asynchronous clear input coupled to the output of the first control element, an asynchronous set input coupled to a predetermined logic state, and an output; and
   a second test circuit having a clock input, an asynchronous clear input responsive to a logical combination of output signals from the first test circuit and the second control element, an asynchronous set input coupled to the predetermined logic state, and an output coupled to the clock input of the second control element.

14. The system of claim 13, wherein the clock input of the second control element is responsive to a logical combination of output signals from the second test circuit and the second control element.

15. The system of claim 13, wherein the first and second control elements are configured to initialize the outputs of the first and second test circuits to predetermined logic states by providing an asserted signal to at least one of the asynchronous clear input and the asynchronous set input of each of the first and second test circuits.

16. The system of claim 13, wherein the control elements and the test circuits comprise flip-flops.

17. The system of claim 13, wherein the test clock has a period indicative of the clear-to-out delays of the test circuits.

18. A system for measuring propagation delays in any number of test circuits, the system including any number of stages arranged as a ring oscillator, each stage comprising:
 a first control element having an asynchronous input, a clock input to receive a test clock, and an output;
 a second control element having an asynchronous input, a clock input, and an output coupled to the asynchronous input of the first control element;
 a first test circuit having a clock input, an asynchronous set input coupled to the output of the first control element, an asynchronous clear input coupled to the output of the second control element, and an output; and
 a second test circuit having a clock input, an asynchronous set input coupled to the output of the first test circuit, an asynchronous clear input coupled to the output of the second control element, and an output coupled to the clock input of the second control element.

19. The system of claim 18, wherein the first and second control elements are configured to initialize the outputs of the first and second test circuits to predetermined logic states by providing an asserted signal to at least one of the asynchronous set input and the asynchronous clear input of each of the first and second test circuits.

20. The system of claim 18, wherein the control elements and the test circuits comprise flip-flops.

21. The system of claim 18, wherein the test clock has a period indicative of the set-to-out delays of the test circuits.

* * * * *